United States Patent [19]

Meza

[11] Patent Number: 4,734,652

[45] Date of Patent: Mar. 29, 1988

[54] METHOD AND APPARATUS FOR WIDEBAND FREQUENCY DISCRIMINATION

[75] Inventor: Jose Meza, Dallas, Tex.

[73] Assignee: E-Systems, Inc., Dallas, Tex.

[21] Appl. No.: 898,147

[22] Filed: Aug. 18, 1986

[51] Int. Cl.$^4$ .......................... H03K 5/00; H03L 7/00
[52] U.S. Cl. ..................... 328/140; 328/133; 307/522; 307/525
[58] Field of Search ............... 328/140, 133; 307/522, 307/525; 333/100

[56] References Cited

U.S. PATENT DOCUMENTS

| | | | |
|---|---|---|---|
| 3,392,337 | 7/1968 | Neuburger | 328/140 |
| 3,748,586 | 7/1973 | Johnson et al. | 307/522 |
| 3,854,099 | 12/1974 | Kratt, 3rd et al. | 329/110 |
| 3,881,157 | 4/1975 | McLaughlin | 329/116 |
| 3,921,082 | 11/1975 | Kratt, 3rd et al. | 329/110 |
| 3,921,083 | 11/1975 | Kratt, 3rd et al. | 329/110 |
| 3,921,084 | 11/1975 | Kratt, 3rd et al. | 329/110 |
| 3,956,706 | 5/1976 | Saul | 328/140 |
| 4,119,919 | 10/1978 | Sugawara | 329/103 |
| 4,451,792 | 5/1984 | Gay | 329/145 |

Primary Examiner—Stanley D. Miller
Assistant Examiner—Richard Roseen
Attorney, Agent, or Firm—Albert M. Crowder, Jr.

[57] ABSTRACT

A method and apparatus for wideband frequency discrimination uses a first power divider for dividing an input signal into first, second and third output signals. First and second delay circuits are provided for receiving the first and second output signals, respectively, and in response thereto generate time-delayed versions of these signals. A second power divider is connected to the first and second delay circuits and to the first power divider for receiving the time-delayed versions of the first and second output signals and for receiving the third output signal and in response thereto generating a vector sum output of these signals. Signal processing circuitry is provided to process the vector sum output to generate a frequency-discriminated signal.

16 Claims, 3 Drawing Figures

METHOD AND APPARATUS FOR WIDEBAND FREQUENCY DISCRIMINATION

TECHNICAL FIELD

The U.S. Government has rights in this invention pursuant to a contract. The present invention relates to signal processing and more particularly to a method and apparatus for wideband frequency discrimination exhibiting improved linearity, resolution and bandwidth.

BACKGROUND OF THE INVENTION

It is well known in the prior art to frequency discriminate an input signal by multiplying this signal by a time-delayed version thereof and filtering the resulting product signal. The time-delay corresponds to a phase shift of the input signal which is dependent on input frequency, and the multiplication results in a signal having a d.c. component varying approximately linearly with the phase shift. To obtain the best resolution with good linearity for a given bandwidth, the time delay is accomplished using a delay line having its center frequency at odd multiples of 90° phase. The delay line is also chosen to exhibit linear phase through the bandwidth of interest.

Although prior art frequency discriminator designs of the delay-line type have proven generally effective in certain applications, such designs have a major disadvantage in that the characteristics of resolution, bandwidth and linearity are all interrelated and fixed. Accordingly, while it may be possible to increase the resolution of a prior art frequency discriminator by a predetermined factor, such increase will cause a corresponding reduction in bandwidth by the same predetermined factor. Likewise, if the linearity of the design is increased by a predetermined factor, the bandwidth will likewise be reduced by this factor.

Accordingly, there is therefore a need for a method and apparatus for wideband frequency discrimination which minimizes the interdependence of the resolution, bandwidth and linearity characteristics of the discriminator and provides improved performance over prior art designs.

BRIEF SUMMARY OF THE INVENTION

A wideband frequency discriminator having improved resolution, bandwidth and linearity is provided for generating a frequency-discriminated signal. In the preferred embodiment, the wideband frequency discriminator includes a first power divider for dividing a limited-filtered input signal into first, second and third output signals. A first delay circuit is connected to the first power divider for receiving the first output and generating a time-delayed version thereof. A second delay circuit is also connected to the first power divider for receiving the second output and generating a time-delayed version thereof. A second power divider is connected to the first and second delay circuits and to the first power divider for receiving the time-delayed versions of the first and second outputs and for receiving the third output and in response thereto generating a vector sum output of these signals. Signal processing circuitry is provided to receive the vector sum output from the second power divider and in response thereto produces the frequency-discriminated signal.

The signal processing circuitry includes a high gain IF amplifier, a fullwave rectifier and a low pass filter. The high gain amplifier is connected to the second power divider for receiving the vector sum output therefrom. The fullwave rectifier preferably includes a 180° hybrid, connected to the output of the If amplifier, and first and second high conductance diodes. The high conductive diodes are driven by the high gain IF amplifier to produce a rectified version of the vector sum output. Undesirable high frequency components are removed from the discriminator output by the low pass filter.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
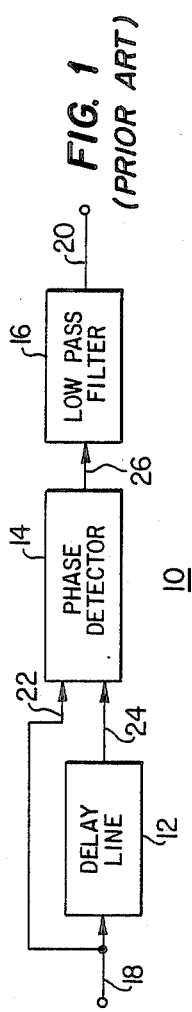
FIG. 1 is a schematic diagram of a prior art frequency discriminator.

With reference now to the drawings, FIG. 1 is a simplified block diagram of a delay-type wideband frequency discriminator 10 of the prior art. Frequency discriminator 10 includes a delay line 12, a phase detector 14, and a low pass filter 16. The input and output terminals of the frequency discriminator 10 are designated by the reference numerals 18 and 20, respectively. The input signal to be converted is applied from the input terminal 18 to the input of the delay line 12 and also as a first input 22 of the phase detector 14. A second input 24 to the phase detector 14 is supplied from the output of the delay line 12. In operation, the phase detector 14 multiplies the input signal by the time-delayed version thereof to produce a product signal on line 26. The time delay provided by the delay line 12 corresponds to a phase shift of the input signal which is dependent on input frequency. The product signal has a d.c. component which varies approximately linearly with the phase shift. Undesired high frequency components are then removed from the discriminated signal by the low pass filter 16.

To obtain the best resolution with good linearity for a given bandwidth, the delay line 12 of the frequency discriminator 10 of the prior art is chosen so that its center frequency ($F_c$) is computed to be an odd multiple of 90°, and the bandwidth required causes approximately a plus or minus 30° phase change. The delay line 12 also exhibits linear phase throughout the bandwidth of interest with a 3 db response at least one bandwidth of interest above the center frequency.

Although the circuit of FIG. 1 produces accurate wideband frequency discrimination, the design of the frequency discriminator 10 suffers from a major disadvantage. Specifically, the important characteristics of resolution, bandwidth and linearity of the frequency discriminator 10 are all interrelated and fixed by the following expression:

$$\text{Resolution} \times \text{Bandwidth} \times \text{Linearity} = \text{Constant} \qquad (1)$$

As can been seen from equation (1), any increase in resolution of the frequency discriminator circuit will decrease bandwidth by the same factor. Likewise, any increase in linearity will also serve to reduce the bandwidth by an equivalent factor if resolution is maintained constant.

There is a need to provide a frequency discriminator which exhibits some degree of independence among the characteristics of resolution, bandwidth and linearity. Such an improved frequency discriminator is shown in FIG. 2.

Figure 2:
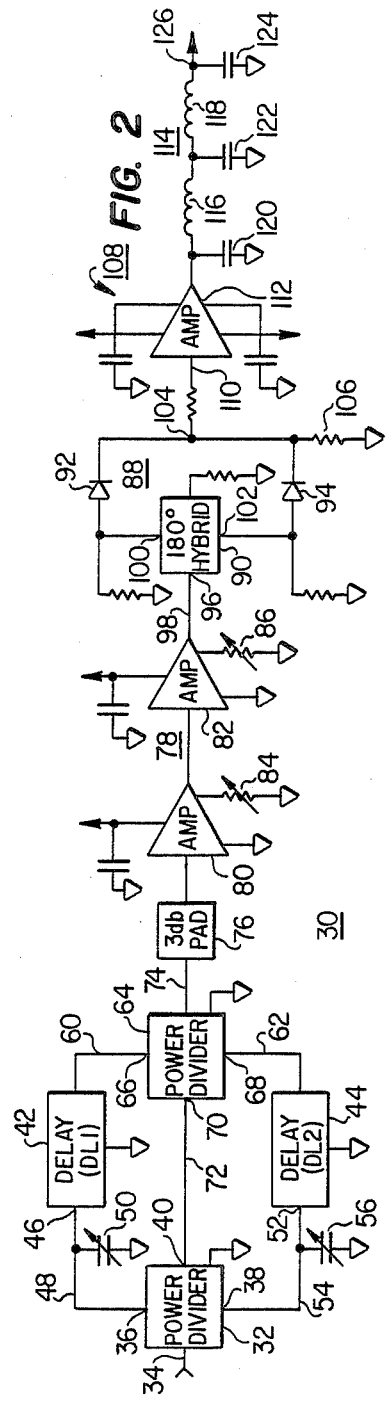
FIG. 2 is a detailed schematic diagram of the preferred frequency discriminator of the present invention.

Referring now to FIG. 2, a detailed schematic diagram is shown of a frequency discriminator 30 of the present invention. The frequency discriminator 30 includes a first power divider 32 having an input terminal 34 for receiving an input signal and in response thereto generating first, second and third output signals on the output terminals 36, 38 and 40, respectively. In the preferred embodiment, the input signal is a sine wave.

The frequency discriminator 30 includes first and second delay circuits 42 and 44 for receiving the first and second outputs, respectively, from the first power divider 32. Specifically, the first delay circuit (DL1) 42 includes an input terminal 46 connected to the output terminal 36 of the first power divider via a conductor 48. A variable capacitor 50 is connected between the conductor 48 and ground. Likewise, the second delay circuit (DL2) 44 has an input terminal 52 connected between the output terminal 38 of the first power divider 32 via a conductor 54. A variable capacitor 56 is connected between the conductor 54 and ground. The first delay circuit 42 receives the first output from the first power divider 32 and generates a time-delayed version thereof on conductor 60. Likewise, the second delay circuit 44 receives the second output from the first power divider 32 and generates a time-delayed version thereof on conductor 62.

The frequency discriminator 30 includes a second power divider 64 having input terminals 66, 68 and 70. Input terminal 66 is connected to conductor 60 to connect the time-delayed version of the first output signal to the second power divider 64. Input terminal 68 is connected to conductor 62 to connect the time-delayed version of the second output to the second power divider 64. Finally, input terminal 70 is connected to a conductor 72 which connects the third output from output terminal 40 of the first power divider 32 to the second power divider 64.

In operation, the second power divider 64 generates a vector sum output of the input signal from the first power divider 32 and the delayed versions thereof output from the first and second delay circuits 42 and 44. The vector sum output from the second power divider 64 represents the discriminated output frequency of the input signal. This signal is supplied via a conductor 74 through a 3 db PAD 76 and then to a high gain IF amplifier 78. Preferably, IF amplifier 78 comprises two stages, the first stage including IF amplifier 80 and the second stage including IF amplifier 82. The amplifiers 80 and 82 include appropriate gain-control elements 84 and 86, respectively, to provide control of the resolution of the frequency discriminator 30.

The output of the IF amplifier 78 is an amplified version of the vector sum output provided by the second power divider 64. This signal is then supplied to a fullwave rectifier 88 comprising a 180° hybrid 90 and a pair of high conductance diodes 92 and 94. Specifically, the output of IF amplifier 78 is supplied to a first input 96 of the hybrid 90 via the conductor 98. The hybrid 90 supplies the signal input thereto to each of the high conductance diodes 92 and 94 via the output terminals 100 and 102. The cathodes of the high conductance diodes 92 and 94 are connected to an output node 104 and also to ground via a resistor 106. The fullwave rectifier 88 generates a rectified version of the amplified vector sum output provided by the IF amplifier 78.

The frequency discriminator 30 also includes a driver circuit 108 for receiving the amplified, rectified version of the vector sum output via the conductor 110. The driver circuit 108 includes an operational amplifier 112 whose output drives a low pass filter 114 comprising inductors 116 and 118 and capacitors 120, 122 and 124. The low pass filter 114 filters out undesired high frequency components generated during the summing of the output signals by the second power divider 64. The low pass filter 114 generates the frequency-discriminated signal at an output terminal 126.

Accordingly, as seen in FIG. 2, the input signal is split by a three-way power divider and summed vectorally after two of the signal paths undergo selected delays. The vector sum output from the second power divider 64 is then amplified by IF amplifier 78, rectified by the fullwave rectifier 88, and filtered by the low pass filter 114 to reduce the undesirable high frequency components. The vector sum output versus frequency produces a bandwidth vs resolution factor approximately ten (10) times better than previous frequency discriminator designs. The linearity factor is also increased approximately five (5) times over prior art designs.

Figure 3:
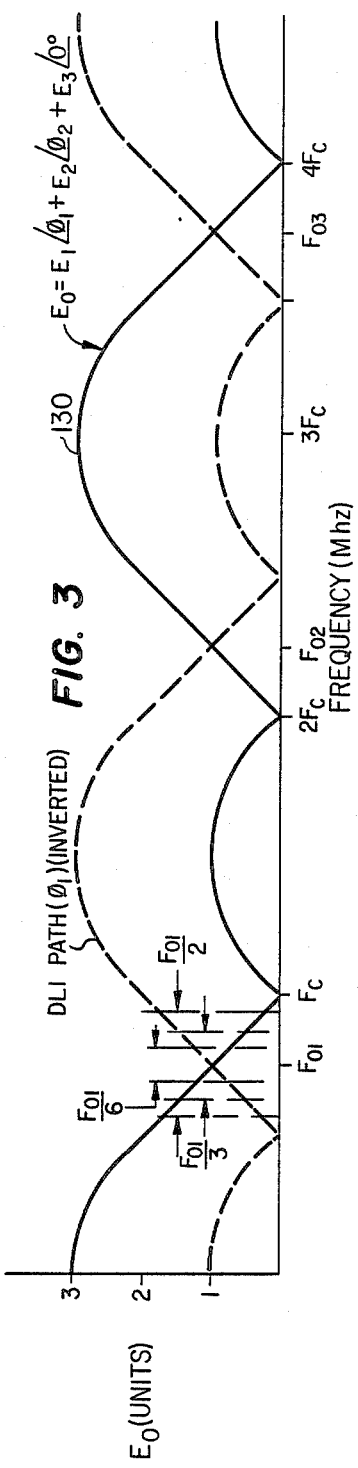
FIG. 3 is a plot of signal voltage versus frequency representing the detected vector sum output of the two delayed and one undelayed signal paths versus frequency provided by the frequency discriminator circuit of FIG. 2.

Referring now to FIG. 3, a plot used to calculate the time delay for the intermediate center frequency ($F_c$) and bandwidth required for the discriminator is shown. By convention, $F_c$ is the frequency at which the first delay circuit 42 (DL1) produces a 120° phase shift and the second delay circuit 44 (DL2) produces a 240° phase shift. The resolution of the frequency discriminator 30 depends on the maximum drive level to the high conductance diodes 92 and 94 of FIG. 2, as well as the points $F_{01}$, $F_{02}$, $F_{03}$ . . . selected for the center frequency. For example, a center frequency of $F_{02}$ has three (3) times the resolution of a center frequency $F_{01}$ with the same maximum drive to the conductance diodes 92 and 94. A center frequency $F_{03}$ has twelve (12) times the resolution of the center frequency $F_{01}$. Accordingly, the present discriminator trades some degree of resolution for bandwidth and vice versa, although the bandwidth vs resolution factor is much higher than previous discriminator designs.

Referring to FIG. 3, the curve 130 represents the detected sum output of the two delayed and the one undelayed signal paths from the first power divider 32 versus frequency. In the preferred embodiment, the phase shift of the first delay circuit 42 is equal to one-third ($\frac{1}{3}$) of the center frequency, and the phase shift of the second delay circuit 44 is equal to two (2) times the phase shift of the first delay circuit 42.

In the preferred embodiment, the following equations are used to customize the bandwidth of the frequency discriminator based on the center frequency ($F_{01}$, $F_{02}$, . . .) desired where $(F_c)(DL1)(360°) = 120°$;

$$F_c = 4/3 F_{01}$$
$$BW = 2(F_c - F_{01})3/2$$
$$= (4/3 F_{01} - F_{01})3/2$$
$$= F_{01}/2$$
$$2F_c + 1/4 F_c = F_{02}$$

-continued $$F_c = 4/9F_{02}$$
$$BW = 2(F_{02} - 2F_c)3/4$$
$$= (F_{02} - 8/9F_{02})3/2$$
$$= F_{02}/6$$
$$4F_c - F_c/16 = F_{03}$$
$$F_c = 16F_{03}/63$$
$$BW = 2(4F_c - F_{03})3/4$$
$$= (64/63F_{03} - F_{03})3/2$$
$$= F_{03}/24$$
$$DL1 = 1/3F_c$$
$$DL2 = 2DL1$$

Therefore, the present invention provides a method and apparatus for frequency discrimination having improved linearity, bandwidth and resolution over the prior art. The approach consists of splitting an input signal with a three-way power divider and summing the resulting signals vectorally after two signal paths undergo selected delays. The vector sum output versus frequency produces a bandwidth vs resolution factor approximately ten (10) times better than previous design techniques. Moreover, with the present approach, the longest delay line is approximately two and one-half (2½) times less than that of a comparable design of the prior art.

Although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A wideband frequency discriminator, comprising:
a first power divider for dividing an input signal into first, second and third output signals;
means connected to the first power divider for receiving the first output signal and generating a time-delayed version thereof and for receiving the second output signal and generating a time-delayed version thereof;
a second power divider connected to said means for receiving and to the first power divider for receiving the time-delayed versions of the first and second output signals and for receiving the third output and in response thereto generating a vector sum output of these signals; and
means connected to the second power divider for processing the vector sum output to generate a frequency-discriminated signal.

2. The wideband frequency discriminator as described in claim 1 wherein said means for processing includes:
a high gain IF amplifier connected to the second power divider for receiving the vector sum output and in response thereto generating an amplified version thereof for processing into the frequency-discriminated signal.

3. The wideband frequency discriminator as described in claim 2 wherein said means for processing further includes:
a fullwave rectifier connected to the high gain IF amplifier for receiving the amplified version of the vector sum output and in response thereto generating a rectified version of this signal for processing to the frequency-discriminated signal.

4. The wideband frequency discriminator as described in claim 3 wherein said fullwave rectifier comprises:

a 180° hybrid circuit connected to the high gain IF amplifier and having first and second outputs; and
first and second diodes connected to said first and second outputs, respectively, for rectifying the amplified version of the vector sum output supplied from the IF amplifier.

5. The wideband frequency discriminator as described in claim 3 wherein said means for processing further includes:
a low pass filter connected to the output of the fullwave rectifier for cancelling high frequency components in the vector sum output for processing in the frequency-discriminated signal.

6. The wideband frequency discriminator as described in claim 1 wherein the means for receiving connected to the first power divider comprises:
a first delay circuit connected to the first power divider for receiving the first output signal and generating the time-delayed version thereof connected to the second power divider; and
a second delay circuit connected to the first power divider for receiving the second output signal and generating the time-delayed version thereof connected to the second power divider.

7. The wideband frequency discriminator as described in claim 1 wherein the phase shift of the first delay circuit equals one-third (⅓) of the center frequency ($F_c$) of the wideband frequency discriminator.

8. The wideband frequency discriminator as described in claim 6 wherein the phase shift of the second delay circuit equals two (2) times the phase shift of the first delay circuit.

9. A wideband frequency discriminator, comprising:
a first power divider for dividing an input signal into first, second and third output signals;
a first delay circuit connected to the first power divider for receiving the first output signal and generating a time-delayed version thereof;
a second delay circuit connected to the first power divider for receiving the second output signal and generating a time-delayed version thereof;
a second power divider connected to the first and second delay circuits and to the first power divider for receiving the time-delayed versions of the first and second outputs signals and for receiving the third output signal and in response thereto generating a vector sum output of these signals;
a high gain IF amplifier connected to the second power divider for receiving the vector sum output and generating an amplified version thereof;
a fullwave rectifier including first and second diodes connected to the high gain IF amplifier for receiving the amplified version of the vector sum output and generating a rectified version thereof, said high gain IF amplifier controlling the gain of said diodes to thereby control the resolution of the frequency discriminator; and
a low pass filter connected to the output of the first and second diodes of said fullwave rectifier for generating a frequency-discriminated signal.

10. The wideband frequency discriminator as described in claim 9 wherein said first delay line has a phase shift equal to one-third (⅓) of a predetermined frequency ($F_c$) of the wideband frequency discriminator.

11. The wideband frequency discriminator as described in claim 10 wherein said second delay circuit has a phase shift equal to two (2) times the phase shift of the first delay circuit.

12. The wideband frequency discriminator as described in claim 9 further including a driver circuit connected between the fullwave rectifier and the low pass filter for increasing the gain of the output from the fullwave rectifier.

13. A method for wideband frequency discrimination, comprising the steps of:
dividing an input signal into first, second and third output signals;
delaying the first output signal to generate a time-delayed version thereof;
delaying the second output signal for generating a time-delayed version thereof;
generating a vector sum output of the time-delayed versions of the first and second outputs and the third output signals; and
processing the vector sum output to generate a frequency-discriminated signal.

14. The method for wideband frequency discrimination as described in claim 13 wherein the step of processing the vector sum output includes the steps of:
amplifying the vector sum output to generate an amplifier version thereof;
rectifying the amplified version of the vector sum output to generate a rectified version thereof; and
filtering the amplified, rectified version of the vector sum output to generate the frequency-discriminated signal.

15. A wideband frequency discriminator, comprising:
means for dividing an input signal into first, second and third output signals;
means connected to said means for dividing for delaying the first output signal to generate a time-delayed version thereof;
means connected to said means for dividing for delaying the second output signal for generating a time-delayed version thereof;
means connected to said means for dividing and to both of said means for delaying for generating a vector sum output of the time-delayed versions of the first and second outputs and the third output signal; and
means connected to said means for generating for processing the vector sum output to generate a frequency-discriminated signal.

16. The wideband frequency discriminator as described in claim 15 wherein the means for processing the vector sum output comprises:
means connecting to said means for generating for amplifying the vector sum output to generate an amplified version thereof;
means connected to means for amplifying for rectifying the amplified version of vector sum outputs to generate a rectified version thereof; and
means connected to said means for rectifying for filtering the amplified, rectified version of the vector sum output to generate the frequency-discriminated signal.

* * * * *